US011948817B2

United States Patent
Carlson et al.

(10) Patent No.: US 11,948,817 B2
(45) Date of Patent: Apr. 2, 2024

(54) ROBOT FOR SIMULTANEOUS SUBSTRATE TRANSFER

(71) Applicant: Applied Materials, Inc., Santa Clara, CA (US)

(72) Inventors: Charles T. Carlson, Austin, TX (US); Jason M. Schaller, Austin, TX (US); Luke Bonecutter, Cedar Park, TX (US); David Blahnik, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/965,491

(22) Filed: Oct. 13, 2022

(65) Prior Publication Data

US 2023/0032854 A1 Feb. 2, 2023

Related U.S. Application Data

(63) Continuation of application No. 16/922,447, filed on Jul. 7, 2020, now Pat. No. 11,476,135.

(Continued)

(51) Int. Cl.
*H01L 21/67* (2006.01)
*B65G 47/90* (2006.01)
(Continued)

(52) U.S. Cl.
CPC ...... *H01L 21/67196* (2013.01); *B65G 47/907* (2013.01); *H01L 21/68* (2013.01); *H01L 21/68707* (2013.01); *H01L 21/67167* (2013.01)

(58) Field of Classification Search
CPC ......... H01L 21/67196; H01L 21/67167; H01L 21/68707; B65G 47/907
See application file for complete search history.

(56) References Cited

U.S. PATENT DOCUMENTS

| 5,513,948 A | 5/1996 | Bacchi et al. |
| 5,667,592 A | 9/1997 | Boitnott et al. |

(Continued)

FOREIGN PATENT DOCUMENTS

| CN | 1909182 A | 2/2007 |
| CN | 107342243 A | 11/2017 |

(Continued)

OTHER PUBLICATIONS

Application No. PCT/US2020/040994, International Preliminary Report on Patentability, dated Jan. 27, 2022, 9 pages.

(Continued)

*Primary Examiner* — Ronald P Jarrett
(74) *Attorney, Agent, or Firm* — Kilpatrick Townsend & Stockton LLP

(57) ABSTRACT

Exemplary substrate processing systems may include a transfer region housing defining an internal volume. A sidewall of the transfer region housing may define a sealable access for providing and receiving substrates. The systems may include a plurality of substrate supports disposed within the transfer region. The systems may also include a transfer apparatus having a central hub including a first shaft and a second shaft concentric with and counter-rotatable to the first shaft. The transfer apparatus may include a first end effector coupled with the first shaft. The first end effector may include a plurality of first arms. The transfer apparatus may also include a second end effector coupled with the second shaft. The second end effector may include a plurality of second arms having a number of second arms equal to the number of first arms of the first end effector.

20 Claims, 9 Drawing Sheets

Related U.S. Application Data

(60) Provisional application No. 62/873,400, filed on Jul. 12, 2019.

(51) Int. Cl.
  *H01L 21/68* (2006.01)
  *H01L 21/687* (2006.01)

(56) References Cited

U.S. PATENT DOCUMENTS

| | | | |
|---|---|---|---|
| 5,765,444 A | 6/1998 | Bacchi et al. | |
| 5,855,465 A | 1/1999 | Boitnott et al. | |
| 6,156,124 A | 12/2000 | Tobin | |
| 6,293,746 B1 | 9/2001 | Ogawa et al. | |
| 6,435,428 B2 | 8/2002 | Kim et al. | |
| 6,635,115 B1 | 10/2003 | Fairbairn et al. | |
| 6,827,815 B2 | 12/2004 | Hytros et al. | |
| 6,962,644 B2 | 11/2005 | Paterson et al. | |
| 7,516,833 B2 * | 4/2009 | Todaka | H01L 21/68721 414/744.1 |
| 8,033,769 B2 | 10/2011 | Gage et al. | |
| 8,336,488 B2 | 12/2012 | Chen et al. | |
| 9,184,072 B2 | 11/2015 | Devine et al. | |
| 9,299,598 B2 * | 3/2016 | Blank | H01L 21/68 |
| 9,449,795 B2 | 9/2016 | Sabri et al. | |
| 9,484,233 B2 | 11/2016 | Leeser | |
| 9,842,757 B2 | 12/2017 | Hosek et al. | |
| 10,109,517 B1 | 10/2018 | Blank et al. | |
| 10,128,134 B2 | 11/2018 | Kondoh | |
| 10,224,182 B2 | 3/2019 | Keil et al. | |
| 10,347,515 B2 | 7/2019 | Heinz | |
| 10,363,665 B2 | 7/2019 | Hosek et al. | |
| 11,117,265 B2 | 9/2021 | Wirth et al. | |
| 11,355,367 B2 | 6/2022 | Schaller et al. | |
| 11,443,973 B2 | 9/2022 | Schaller et al. | |
| 11,476,135 B2 | 10/2022 | Carlson et al. | |
| 11,515,676 B2 | 11/2022 | Mishra et al. | |
| 11,574,826 B2 | 2/2023 | Schaller et al. | |
| 11,626,303 B2 | 4/2023 | Kalsekar | |
| 11,670,492 B2 | 6/2023 | Wu et al. | |
| 2002/0071756 A1 * | 6/2002 | Gonzalez | H01L 21/68707 414/941 |
| 2003/0003848 A1 | 1/2003 | Tobin | |
| 2003/0082042 A1 * | 5/2003 | Woodruff | H01L 21/68707 414/744.5 |
| 2003/0113187 A1 | 6/2003 | Lei et al. | |
| 2004/0127142 A1 | 7/2004 | Olgado | |
| 2004/0197179 A1 * | 10/2004 | Achkire | H01L 21/6704 414/618 |
| 2005/0031497 A1 | 2/2005 | Siebert et al. | |
| 2007/0031236 A1 | 2/2007 | Chen | |
| 2007/0034479 A1 | 2/2007 | Todaka | |
| 2007/0059127 A1 | 3/2007 | Guo et al. | |
| 2007/0207014 A1 | 9/2007 | Toshima | |
| 2008/0000422 A1 | 1/2008 | Park et al. | |
| 2010/0294199 A1 | 11/2010 | Tran et al. | |
| 2012/0063874 A1 | 3/2012 | Kremerman | |
| 2013/0059440 A1 | 3/2013 | Wang et al. | |
| 2013/0076055 A1 * | 3/2013 | Hino | H01L 21/67742 294/213 |
| 2013/0269609 A1 | 10/2013 | Leeser | |
| 2014/0010625 A1 | 1/2014 | Hudgens et al. | |
| 2014/0154038 A1 | 6/2014 | Hudgens et al. | |
| 2014/0265090 A1 | 9/2014 | Hou | |
| 2015/0063957 A1 | 3/2015 | Olgado | |
| 2016/0289838 A1 | 10/2016 | Bansal et al. | |
| 2016/0307782 A1 | 10/2016 | Weaver et al. | |
| 2016/0355927 A1 | 12/2016 | Weaver et al. | |
| 2017/0040203 A1 | 2/2017 | Caveney et al. | |
| 2017/0040204 A1 | 2/2017 | Kim et al. | |
| 2017/0306493 A1 | 10/2017 | Raj et al. | |
| 2018/0033674 A1 | 2/2018 | Jeong et al. | |
| 2018/0286728 A1 | 10/2018 | Moura et al. | |
| 2019/0164790 A1 | 5/2019 | Liu | |
| 2019/0355605 A1 | 11/2019 | Hudgens et al. | |
| 2020/0094399 A1 | 3/2020 | Shindo et al. | |
| 2020/0402827 A1 | 12/2020 | Uziel et al. | |
| 2021/0008727 A1 | 1/2021 | Wirth et al. | |
| 2021/0013068 A1 | 1/2021 | Schaller et al. | |
| 2021/0013069 A1 | 1/2021 | Kalsekar et al. | |
| 2021/0013084 A1 | 1/2021 | Schaller et al. | |
| 2021/0335635 A1 | 10/2021 | Kalsekar | |
| 2022/0020615 A1 | 1/2022 | Pathak et al. | |
| 2023/0069317 A1 | 3/2023 | Chandrasekar et al. | |
| 2023/0124246 A1 | 4/2023 | Chakravarthy et al. | |

FOREIGN PATENT DOCUMENTS

| | | |
|---|---|---|
| JP | 11163075 A | 6/1999 |
| JP | 2007049157 A | 2/2007 |
| JP | 4951201 B2 | 3/2012 |
| JP | 5463367 B2 | 4/2014 |
| KR | 100376963 B1 | 3/2003 |
| KR | 20070053538 A | 5/2007 |
| KR | 101394111 B1 | 5/2014 |
| KR | 20150101785 A | 9/2015 |
| KR | 101715887 B1 | 3/2017 |
| KR | 20190074481 A | 6/2019 |
| TW | 200809947 A | 2/2008 |
| TW | 201139250 A | 11/2011 |
| TW | 201145448 A | 12/2011 |
| TW | 201425189 A | 7/2014 |
| TW | 201724340 A | 7/2017 |

OTHER PUBLICATIONS

Application No. PCT/US2020/040994, International Search Report and Written Opinion, dated Oct. 14, 2020, 12 pages.
Application No. PCT/US2020/041015, International Preliminary Report on Patentability, dated Jan. 27, 2022, 10 pages.
Application No. PCT/US2020/041015, International Search Report and Written Opinion, dated Oct. 20, 2020, 13 pages.
Application No. PCT/US2020/041103, International Preliminary Report on Patentability, dated Jan. 27, 2022, 6 pages.
Application No. PCT/US2020/041103, International Search Report and Written Opinion, dated Oct. 13, 2020, 9 pages.
Application No. PCT/US2020/041156, International Preliminary Report on Patentability, dated Jan. 27, 2022, 6 pages.
Application No. PCT/US2020/041156, International Search Report and Written Opinion, dated Oct. 23, 2020, 9 pages.
Application No. PCT/US2020/041157, International Preliminary Report on Patentability, dated Jan. 27, 2022, 10 pages.
Application No. PCT/US2020/041157, International Search Report and Written Opinion, dated Oct. 29, 2020, 13 pages.
Application No. PCT/US2020/041202, International Preliminary Report on Patentability, dated Jan. 27, 2022, 9 pages.
Application No. PCT/US2020/041202, International Search Report and Written Opinion, dated Oct. 29, 2020, 12 pages.

* cited by examiner

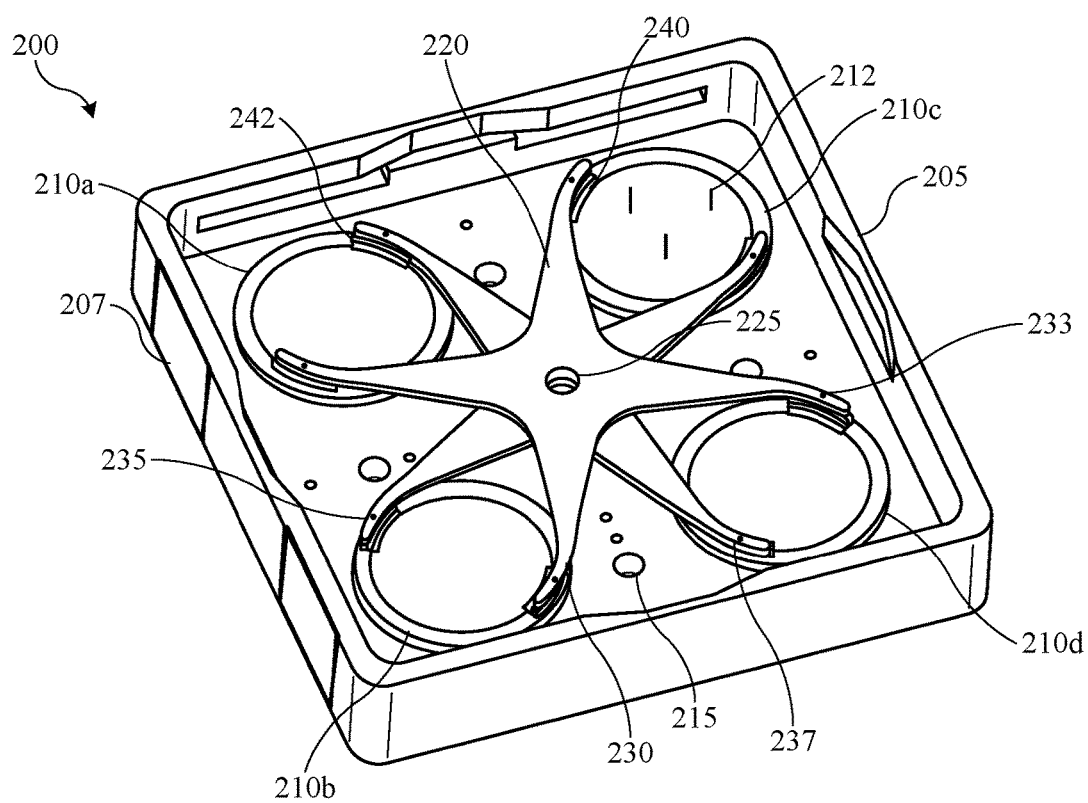
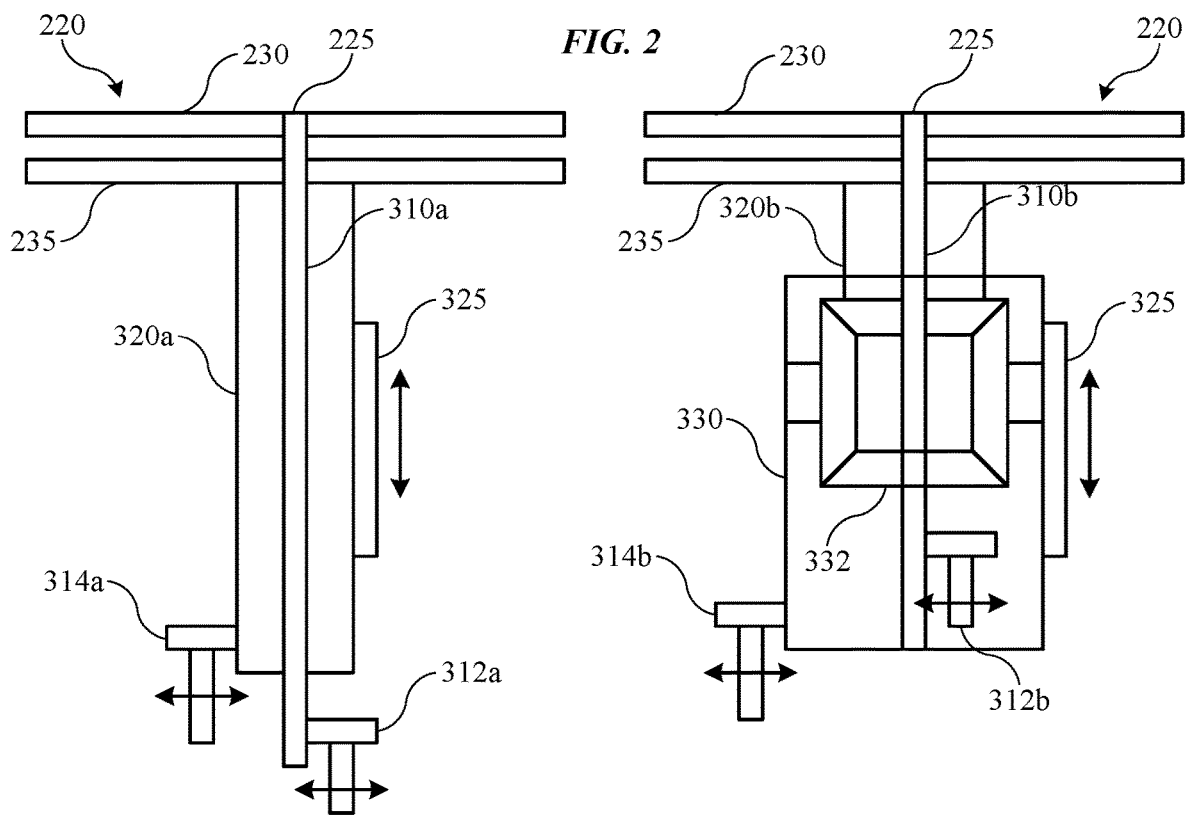
FIG. 2
FIG. 3A          FIG. 3B

ROBOT FOR SIMULTANEOUS SUBSTRATE TRANSFER

CROSS-REFERENCES TO RELATED APPLICATIONS

This application is a continuation of U.S. Non-Provisional patent application Ser. No. 16/922,447, filed 7 Jul. 2020, which claims the benefit of priority of U.S. Provisional Patent Application No. 62/873,400, filed 12 Jul. 2019, the contents of which are hereby incorporated by reference in its entirety for all purposes. The present technology is further related to the following applications, all concurrently filed 12 Jul. 2019, and titled: "ROBOT FOR SIMULTANEOUS SUBSTRATE TRANSFER" (U.S. Provisional Patent Application No. 62/873,432), "ROBOT FOR SIMULTANEOUS SUBSTRATE TRANSFER" (U.S. Provisional Patent Application No. 62/873,458), "ROBOT FOR SIMULTANEOUS SUBSTRATE TRANSFER" (U.S. Provisional Patent Application No. 62/873,480), "MULTI-LID STRUCTURE FOR SEMICONDUCTOR PROCESSING SYSTEMS" (U.S. Provisional Patent Application No. 62/873,518), and "HIGH-DENSITY SUBSTRATE PROCESSING SYSTEMS AND METHODS" (U.S. Provisional Patent Application No. 62/873,503). Each of these applications is hereby incorporated by reference in their entirety for all purposes.

TECHNICAL FIELD

The present technology relates to semiconductor processes and equipment. More specifically, the present technology relates to substrate processing systems.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate.

Thus, there is need for improved systems and methods that can be used to efficiently direct substrates within cluster tool environments. These and other needs are addressed by the present technology.

SUMMARY

Exemplary substrate processing systems may include a transfer region housing defining a transfer region. A sidewall of the transfer region housing may define a sealable access for providing and receiving substrates. The systems may include a plurality of substrate supports disposed within the transfer region. The systems may also include a transfer apparatus. The transfer apparatus may include a central hub including a first shaft and a second shaft extending about and concentric with the first shaft. The second shaft may be counter-rotatable with the first shaft. The transfer apparatus may include a first end effector coupled with the first shaft. The first end effector may include a plurality of first arms having a number of first arms equal to a number of substrate supports of the plurality of substrate supports. The transfer apparatus may also include a second end effector coupled with the second shaft. The second end effector may include a plurality of second arms having a number of second arms equal to the number of first arms of the first end effector.

In some embodiments, the plurality of substrate supports may include at least four substrate supports. The second end effector may be vertically offset from the first end effector along the central hub. The first end effector may also include a plurality of first end pieces, each first end piece coupled with a separate first arm of the plurality of first arms. The second end effector may also include a plurality of second end pieces, each second end piece coupled with a separate second arm of the plurality of second arms. Each first end piece and each second end piece may extend vertically to a similar plane extending orthogonally to the central hub. Each first end piece and each second end piece may define a recessed ledge and a shelf Each first end piece and each second end piece may be characterized by an arcuate exterior profile. Each first end piece may include a force-generating plunger configured to releasably engage a substrate against a corresponding second end piece. The central hub may be vertically translatable along a central axis of the central hub.

Some embodiments of the present technology may include methods of transferring a substrate. The methods may include receiving a substrate at a first substrate support within a transfer region of a substrate processing system. The substrate processing system may include a transfer apparatus. The transfer apparatus may include a central hub including a first shaft and a second shaft extending about and concentric with the first shaft. The transfer apparatus may include a first end effector coupled with the first shaft, and the first end effector may include a plurality of first arms. The transfer apparatus may also include a second end effector coupled with the second shaft, and the second end effector may include a plurality of second arms. The methods may include rotating the first shaft in a first direction about a central axis of the central hub. The methods may include rotating the second shaft in a second direction about the central axis of the central hub. The methods may include engaging the substrate with a first arm of the plurality of first arms and a second arm of the plurality of second arms. The methods may include co-rotating the first arm and the second arm about the central axis to reposition the substrate.

The methods may also include delivering the substrate to a second substrate support of the substrate processing system.

In some embodiments, the methods may include disengaging the substrate from the transfer apparatus by rotating the first shaft in the second direction about the central axis and rotating the second shaft in the first direction about the central axis. The methods may include, subsequent engaging the substrate, lifting the substrate from the first substrate support by translating the transfer apparatus vertically within the transfer region. The methods may include, subsequent engaging the substrate, recessing the first substrate support from the substrate. The first end effector may include a plurality of first end pieces, each first end piece coupled with a separate first arm of the plurality of first arms. The second end effector may include a plurality of second end pieces, each second end piece coupled with a separate second arm of the plurality of second arms. Each first end piece and each second end piece may define a recessed ledge and a shelf. Engaging the substrate may include extending the shelf of the first end piece of the first arm and the shelf of the second end piece of the second arm beneath an exterior edge of the substrate. The substrate processing system may include at least four substrates, and engaging the substrate may include simultaneously engaging the at least four substrates with the first end effector and the second end effector. The methods may also include, prior to delivering the substrate to the second substrate support, delivering the substrate to an alignment hub positioned between the first substrate support and the second substrate support.

Some embodiments of the present technology may include substrate processing systems including a transfer region housing defining a transfer region. A sidewall of the transfer region housing may define a sealable access for providing and receiving substrates. The systems may include a plurality of substrate supports disposed within the transfer region. The systems may include a transfer apparatus. The transfer apparatus may include a central hub including a first shaft and a second shaft extending about and concentric with the first shaft. The second shaft may be independently rotatable from the first shaft. The transfer apparatus may include a first end effector coupled with the first shaft. The first end effector may include a plurality of first arms extending radially outward from the central hub to a distal end of each first arm of the plurality of first arms. Each first arm may be characterized by an arcuate shape extending along a first arc path to the distal end of each first arm. The transfer apparatus may include a second end effector coupled with the second shaft. The second end effector may include a plurality of second arms extending radially outward from the central hub to a distal end of each second arm of the plurality of second arms. Each second arm may be characterized by an arcuate shape extending along a second arc path to the distal end of each second arm. The second arc path may be the first arc path mirrored about a lateral axis extending from the central hub normal to a central axis of the central hub.

In some embodiments, the first end effector may include a plurality of first end pieces, each first end piece coupled with a separate first arm of the plurality of first arms. The second end effector may also include a plurality of second end pieces, each second end piece coupled with a separate second arm of the plurality of second arms. The central hub may be vertically translatable along the central axis of the central hub.

Such technology may provide numerous benefits over conventional systems and techniques. For example, the handling systems may provide increased transfer speeds compared to conventional designs. Additionally, the handling systems may accommodate transfer regions having multiple rows of substrates. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 2 shows a schematic perspective view of a transfer region of an exemplary chamber system according to some embodiments of the present technology.

FIGS. 3A-3B show schematic cross-sectional views of exemplary transfer apparatuses according to some embodiments of the present technology.

Figure 1A:
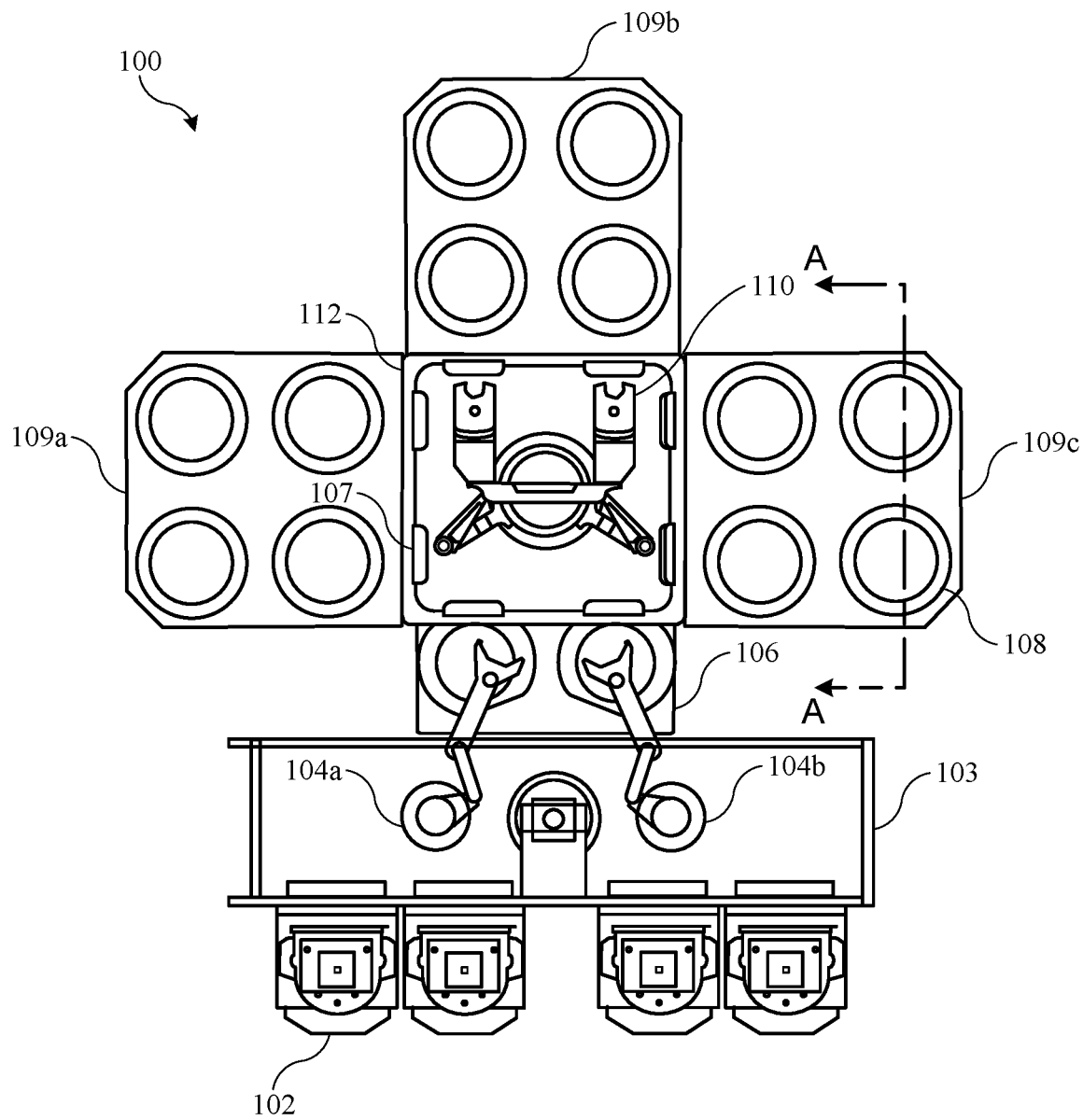
FIG. 1A shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region. Although the remaining disclosure will routinely identify specific structures, such as four-position transfer regions, for which the present structures and methods may be employed, it will be readily understood that the systems and methods are equally applicable to any number of structures and devices that may benefit from the transfer capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
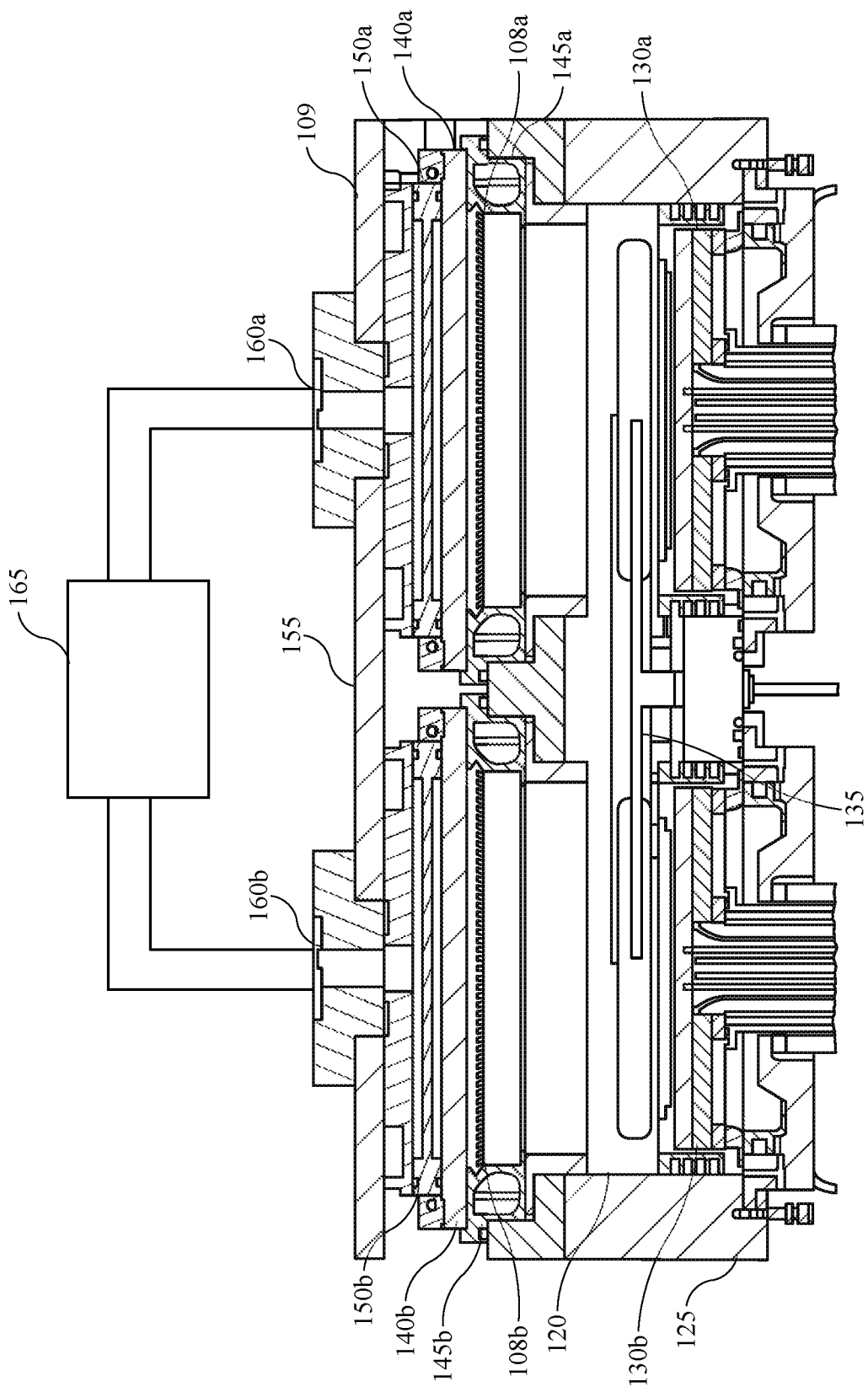
FIG. 1B shows a schematic partial cross-sectional view of an exemplary chamber system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109, such as illustrated through line A-A in FIG. 1A. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. In some embodiments, such as illustrated, lid 155 may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

As noted, processing system 100, or more specifically quad sections or chamber systems incorporated with system 100 or other processing systems, may include transfer regions positioned below the processing chamber regions illustrated. FIG. 2 shows a schematic isometric view of an exemplary substrate processing system 200 according to some embodiments of the present technology. The system illustrated may include a transfer region housing 205 defining an internal volume or transfer region in which a number of components may be included. The transfer region may additionally be at least partially defined from above by processing chambers, such as processing chambers illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included. It is also to be understood that substrate processing system 200 may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210*a* or 210*b* through the accesses 207, and may deliver substrates directly to a transfer apparatus within the transfer region in some embodiments. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chambers, such as processing chambers 108, positioned above the transfer region housing 205.

The transfer region housing 205 may provide access for alignment systems 215, which may include an aligner that can extend through an aperture of the transfer region as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. Although exemplary operations will be described below, in one example, transfer apparatus 220 may move substrates on substrate supports 210*a* and 210*b* to substrate supports 210*c* and 210*d*, which may allow additional substrates to be delivered into the transfer region.

Transfer apparatus 220 may include a central hub 225 that may include one or more shafts extending into the transfer region. Coupled with the central hub may be a first end effector 230, and a second end effector 235. First end effector 230 may include a plurality of first arms 233 extending radially or laterally outward from the central hub. Similarly, second end effector 235 may include a plurality of second arms 237 extending radially or laterally outward from the central hub. Although illustrated with a central body from which the arms extend, each of the end effectors may additionally include separate arms that are each coupled with the central hub 225. Any number of arms may be included in embodiments of the present technology. In some embodiments a number of first arms 233 may be similar or equal to the number of substrate supports 210 included in the chamber, and the number of second arms 237 may be similar or equal to the number of first arms 233. Hence, as illustrated, for four substrate supports, transfer apparatus 220 may include four arms for each of the first end effector and the second end effector. The arms may be characterized by any number of shapes and profiles, such as straight profiles, as well as arcuate profiles as illustrated. Although any profile may be utilized, in some embodiments an arcuate profile may accommodate a substrate, which may be circular in some embodiments.

When used, the arcuate profiles of the first arms of the first end effector may be characterized by a particular arc profile extending along an edge of each first arm to a distal end of the first arm. Additionally, the second arms of the second end effector may also be characterized by a particular arc profile extending along an edge of each second arm to a distal end. However, the arc profile of the second arms may be reversed or mirrored from the arc profile of the first arms, which may accommodate an opposite edge of a substrate being transferred. The mirroring may be along an axis extending radially or laterally outward from the central hub between a first arm of the first end effector and a second arm of the second end effector, such as an axis normal to a central axis extending vertically through the central hub. Consequently, in some embodiments the second end effector may be an inverted version of the first end effector as illustrated.

The first end effector 230 may additionally include a plurality of first end pieces 240. Each first end piece 240 may be coupled with a separate first arm of the plurality of first arms 233. Similarly, second end effector 235 may additionally include a plurality of second end pieces 242. Each second end piece 242 may be coupled with a separate second arm of the plurality of second arms 237. Each end piece may also be characterized by an arcuate exterior profile to accommodate a circular or otherwise arcuate substrate. The end pieces will be described in more detail below, and may be used to contact substrates during transfer or movement. The end pieces as well as the end effectors may be made from or include a number of materials including conductive and/or insulative materials. The materials may be coated or plated in some embodiments to withstand contact with precursors or other chemicals that may pass into the transfer region from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics. Component couplings may also be adapted for operation in high temperature and/or corrosive environments. For example, where end effectors and end pieces are each ceramic, the coupling may include press fittings, snap fittings, or other fittings that may not include additional materials, such as bolts, which may expand and contract with temperature, and may cause cracking in the ceramics. In some embodiments the end pieces may be continuous with the end effectors, and may be monolithically formed with the end effectors. Any number of other materials may be utilized that may facilitate operation or resistance during operation, and are similarly encompassed by the present technology.

The transfer apparatus 220 may include a number of components and configurations that may facilitate the movement of the end effectors as will be described further below. FIGS. 3A-3B show schematic cross-sectional views of exemplary transfer apparatus 220 according to some embodiments of the present technology, although it is to be understood that any other configurations affording the independent rotational movement to be described are similarly encompassed by the present technology.

Central hub 225 may include a first shaft 310 and a second shaft 320, which may be axially aligned with first shaft 310. For example, first shaft 310 and second shaft 320 may be concentric about a central axis extending vertically through the central hub. In some embodiments first shaft 310 may extend through second shaft 320, or aspects of second shaft 320. As illustrated in FIG. 3A, first shaft 310 and second shaft 320 may be coaxial, although the two shafts may be coupled with separate motor or drive systems. As illustrated, first shaft 310a may be coupled with a first drive system 312a, which may include a motor, and which may allow rotation about the central axis, which may rotate first end effector 230 in a first direction about the central axis, or in a second direction opposite the first. Similarly, second shaft 320a may be coupled with a second drive system 314a, which may independently allow rotation of second end effector 235 in the first direction or the second direction about the central axis. In some embodiments a vertical translation drive 325 may be included, which may allow the transfer apparatus to be vertically translated along the central axis. This may facilitate lifting substrates from substrate supports or lift pins in some embodiments, although in some embodiments the lift pins and/or substrate supports may be used to raise and lower substrates, and transfer apparatus 220 may not include a vertical drive mechanism.

FIG. 3B illustrates another embodiment of transfer apparatus 220 which may utilize a gear box to facilitate counter rotation of the first shaft 310b relative to the second shaft 320b. For example, second shaft 320b may be coupled with a gear box 330 including a gear set 332 having a first gear coupled with the first shaft 310b. As would be readily understood, driving the first gear in a first direction with first drive system 312b would produce a counter rotation in the opposite gear, which may be coupled with second shaft 320b and second end effector 235. Additionally, a second drive system 314b may be coupled with the components to rotate the gear box and first shaft together, which would facilitate co-rotation of the end effectors. The figure also shows the optional vertical translation drive 325, which may linearly move the transfer apparatus up or down as described above. It is to be understood that FIGS. 3A-3B are merely illustrative of any number of configurations and components that may be used to independently rotate the first shaft and second shaft affording separate control of the first end effector and second end effector. Consequently, in some embodiments the first shaft and second shaft may be co-rotated about the central axis, or the two shafts may be counter-rotated with respect to the other shaft. This operation will be described in more detail below.

As illustrated in both figures, the first end effector 230 and the second end effector 235 may be vertically offset from one another along the central hub in some embodiments. This may offset associated components in some embodiments, such as the first end pieces and the second end pieces. Accordingly, the present technology may further modify the first end pieces and the second end pieces to accommodate the vertical offset of the first end effector and the second end effector as will be described further below.

Figure 4:
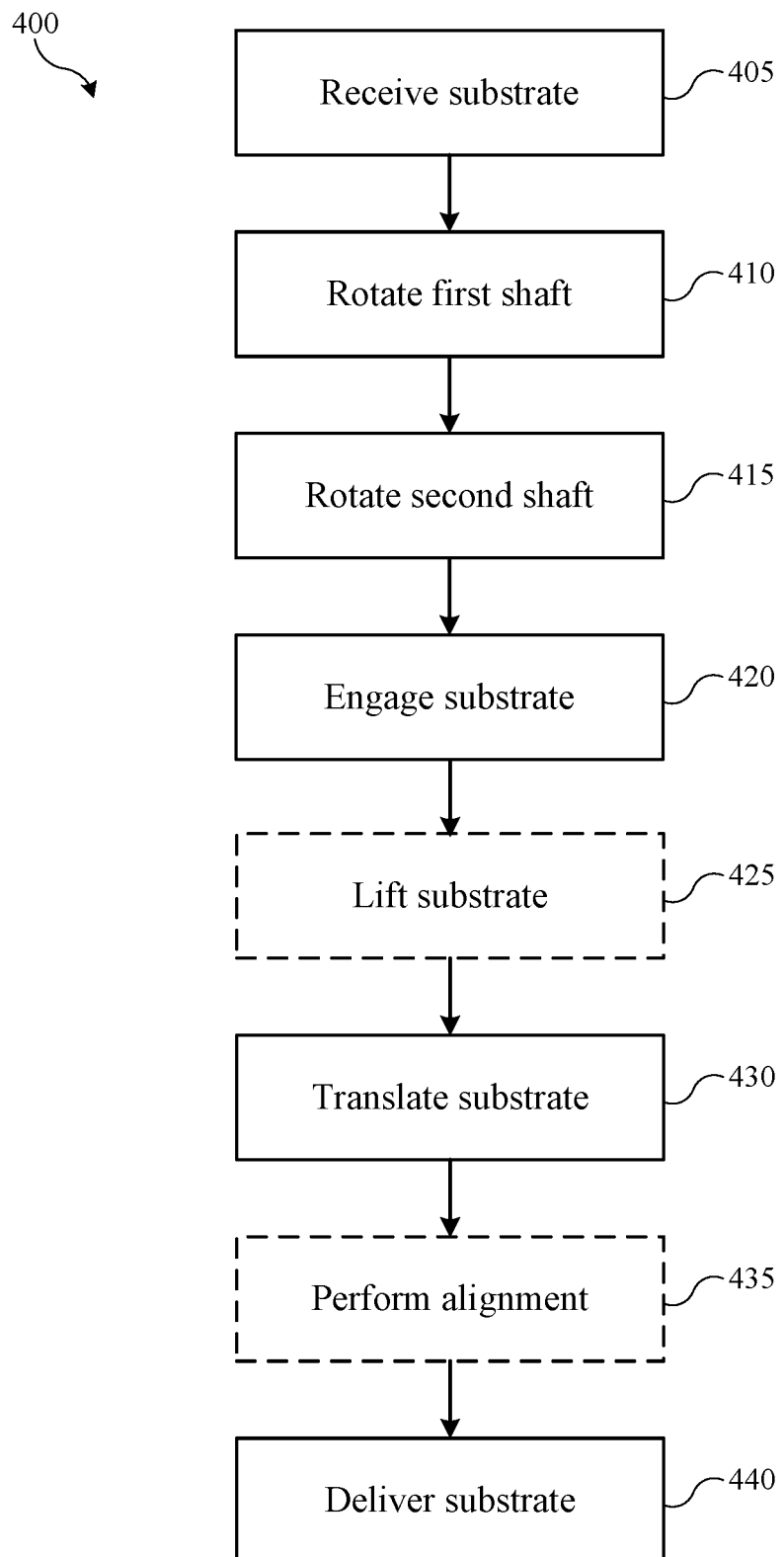
FIG. 4 shows exemplary operations in a method of transferring substrates according to some embodiments of the present technology.

FIG. 4 shows exemplary operations in a method 400 of transferring a substrate according to some embodiments of the present technology. Method 400 may be performed in one or more transfer systems, such as system 200, which may be incorporated into processing system 100, for example. The method may include a number of optional operations as denoted in the figure, which may or may not be specifically associated with some embodiments of methods according to the present technology. Method 400 describes operations shown schematically in FIGS. 5A-5H, the illustrations of which will be described in conjunction with the operations of method 400. It is to be understood that FIG. 5 illustrates only partial schematic views with limited details, and in some embodiments the systems may include more or less substrate supports and other components, as well as alternative structural aspects that may still benefit from any of the aspects of the present technology.

Figure 5A:
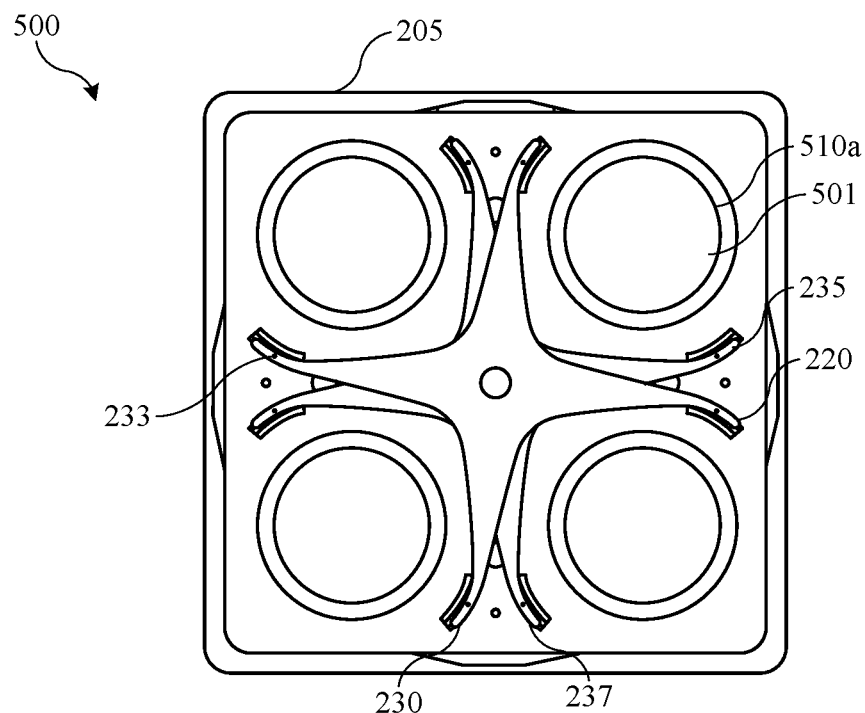
FIGS. 5A-5H show schematic top plan views of substrates being transferred according to some embodiments of the present technology.

FIG. 5A may illustrate a substrate processing system 500 as previously described, and may include any of the features and aspects of substrate processing system 200 described above, including any of the drive components discussed previously with FIG. 3, as well as any other drive components as would be understood are similarly encompassed by the present technology. Additionally, system 500 may be illustrated with a number of substrates 501 disposed within the chamber, such as seated on substrate supports 510 as illustrated. The figure may show a configuration of the present technology subsequent initial operations of method 400, which may include receiving a substrate at a first substrate support 510a at operation 405, such as through an access with a robot as previously described. The robot may deliver one or two, or more, substrates into the transfer region 205 onto the substrate supports proximate the accesses or slit valves. Transfer apparatus 220 may rotate the two substrates to the opposite substrate supports, and two additional substrates may be delivered. It is to be understood that the same process can be performed with any number of substrates, including delivery of one substrate at a time into the processing chamber. FIG. 5A may illustrate after four substrates have been positioned within the transfer region, and the transfer apparatus 220 may be positioned in a recessed configuration.

Figure 5B:
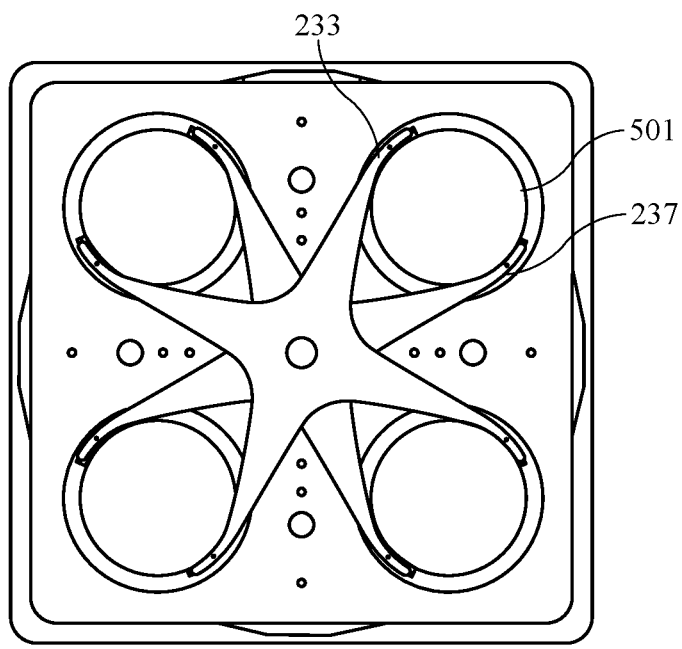

A transfer process may involve rotating the transfer apparatus in a number of ways. For example, to engage the substrates, the method may include rotating the first shaft of the central hub in a first direction about a central axis of the central hub at operation 410. Previously, subsequently, or concurrently, the method may include rotating the second shaft in a second direction about the central axis of the second hub at operation 415. The second direction may be the opposite rotation of the first direction as previously described. The rotation may continue until a first arm 233 of the first end effector 230 and a second arm 237 of the second end effector 235 engage a substrate at operation 420, as illustrated in FIG. 5B.

Depending on the transfer apparatus having vertical movement capabilities or not, the movement and engagement may or may not include raising or lowering one or both of the substrates or the transfer apparatus. Additionally, engaging the substrate may include one or more operations including a passive engagement and an active engagement in some embodiments. For example, as will be explained further below, the end pieces of the first end effector and the second end effector may include a variety of forms facilitating engagement. In one form of passive engagement, the end pieces may define a recessed ledge and shelf on which a substrate may be seated. Accordingly, with end pieces in this configuration, the first arms and second arms may counter rotate towards the substrate until a shelf of each end piece extends below an edge of the substrate. In a form of active engagement, one or both of the end pieces may physically and/or forcibly engage a substrate, including compressing or clamping the substrate between the end pieces. When more than one substrate is incorporated within the transfer region, the substrates may be simultaneously engaged as illustrated in FIG. 5B. Because the arms may be equidistantly distributed about the central hub, the arms may be configured to engage all substrates together.

Once the substrates have been engaged by the transfer apparatus, a complete transfer of the substrate or substrates may be made between the substrate supports and the transfer apparatus. For example, in some embodiments the transfer apparatus may lift the substrates in optional operation 425, and from the substrate supports or lift pins on which the substrates may be seated. This may be performed by vertically translating the transfer apparatus, for example. In some embodiments, the substrate supports may recess away from the substrate or substrates to complete the transfer.

Figure 5C:
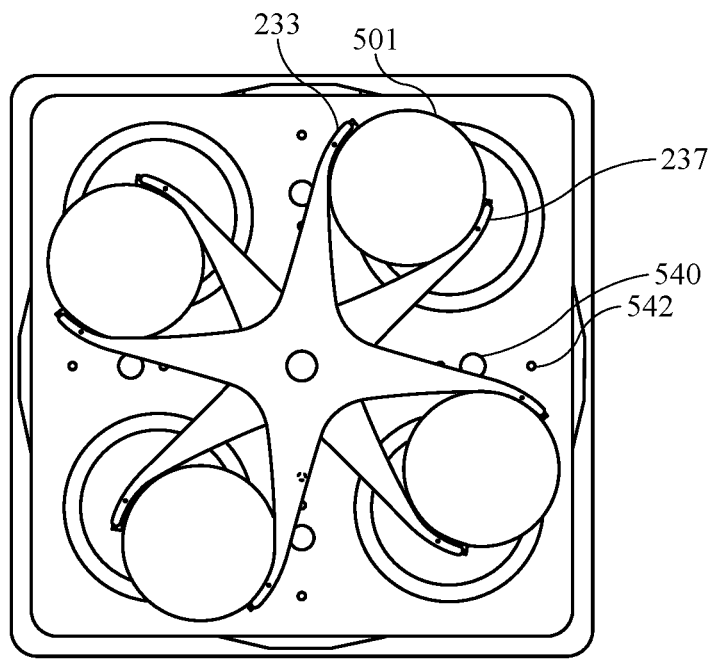

After the transfer is complete to the transfer apparatus, the substrates may be rotated between the substrate supports for further processing in different chambers, or to deliver the substrates to substrate supports accessible by a transfer robot, such as second robotic arm 110 described above. Translation of the substrate or substrates may occur at operation 430, and as illustrated in FIG. 5C. Although the figure illustrates a counterclockwise rotation, it is to be understood that the substrates can be rotated in either direction about the central axis in embodiments. The rotational translation of the substrates may be performed by co-rotating the first arm 233 and the second arm 237 at a common rate to maintain the engagement of the substrate 501. As illustrated, the co-rotation may occur along the second direction about the central axis. Consequently, the direction of rotation of the first shaft may be reversed, while the rotation of the second shaft may continue in the same direction as used for engagement. Of course, if translation of the substrate proceeded along the first direction, the directions of the shaft rotation would be the opposite as well.

Figure 5D:
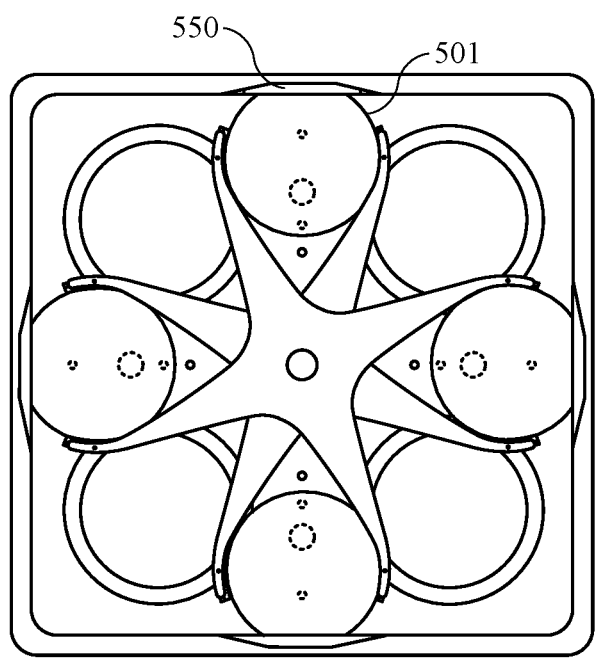

As previously noted, substrate processing systems according to embodiments of the present technology may have monitoring and alignment systems, including an alignment hub 540 positioned between each pair of substrate supports. Additional access port 542 may allow a camera or laser to impinge on the substrate to identify misalignment, which could be based on a notch or other identifier on the substrate. In some embodiments an optional alignment operation may be performed on each of the substrates at optional operation 435. In some embodiments, the transfer apparatus may release the substrates onto an aligner when the substrates have been translated over the alignment devices as illustrated in FIG. 5D. One or more of the aligners, depending on how many substrates are being translated, may protrude into the transfer region and receive the substrates. An alignment adjustment may be performed, and the transfer apparatus may re-engage the substrates.

Additionally illustrated in FIG. 5D may be an aspect of the transfer region to accommodate the rotation of the substrate through the chamber. As illustrated, during rotation the substrate may pass a zenith position in between adjacent substrate supports. While transfer region 205 may be rectilinear, a path of rotation may be elliptical or circular as illustrated. In some embodiments, transfer region 205 may be large enough to extend beyond the path of rotation. However, in some embodiments, transfer region 205 may include an accommodation along the path where a recess 550 may be formed in the transfer region wall to limit or prevent impact between a substrate 501 being translated and a wall of the transfer region. Such a recess 550 may be formed in each wall of the transfer region in some embodiments.

Figure 5E:
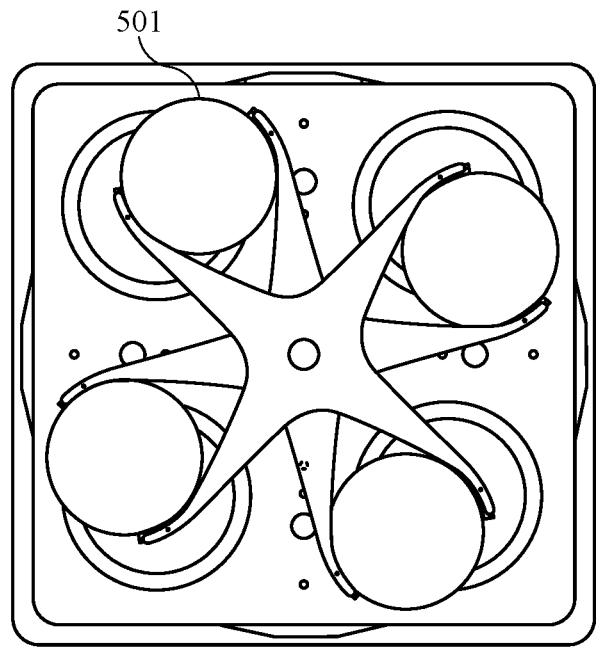
Figure 5F:
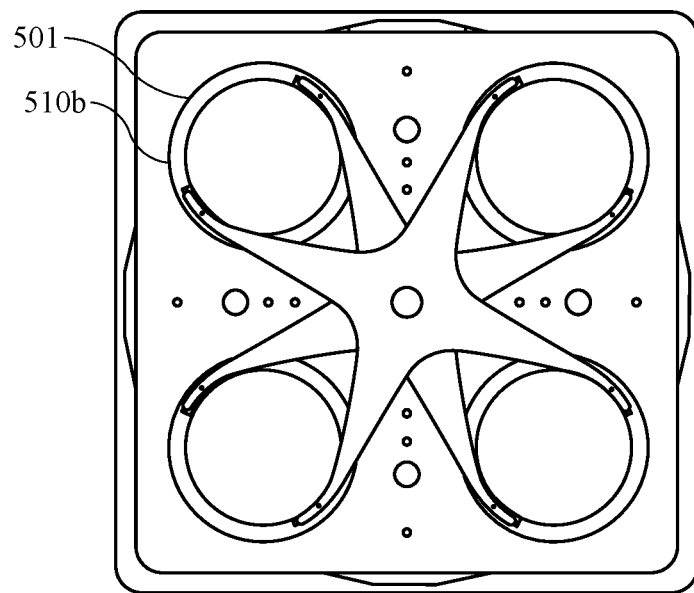

As illustrated in FIG. 5E, the transfer apparatus may continue to rotate the substrates towards a substrate support to which the substrate 501 is to be delivered. Although illustrating a transfer to an adjacent substrate support in a counterclockwise direction, it is to be understood that delivery to any other substrate support in either rotational direction may similarly be performed. At operation 440 the substrate 501 may be delivered to a second substrate support 510b as illustrated in FIG. 5F. Once delivered, the transfer apparatus may disengage the substrate from the transfer apparatus. Again, the substrate may be lowered with the transfer apparatus, and/or the substrate support, or lift pins of the substrate support may engage the substrate to accept the substrate from the transfer apparatus.

Figure 5G:
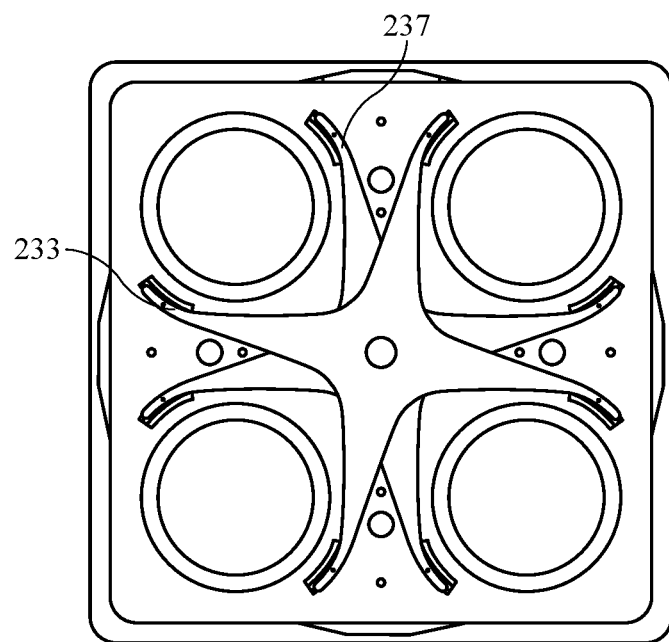
Figure 5H:
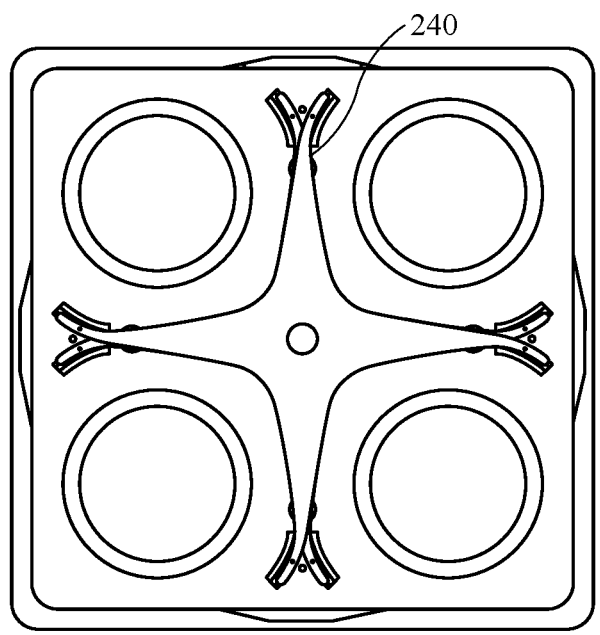

The disengagement may also include rotating the first shaft and the second shaft in opposite directions from the original movements for engagement. For example, as illustrated in FIG. 5G, the first shaft may be rotated in the second direction while the second shaft may be rotated in the first direction to separate the first arms 233 of the first end effector and the second arms 237 of the second end effector from one another away from the substrates. The arms may be rotated to a recessed configuration to avoid interaction with the substrate supports during further processing as illustrated in FIG. 5H. Additionally, such a position may align the arms of the first end effector and the second end effector over the alignment hub 540 when included, which may provide protection for the alignment hub against particle accumulation, for example.

Figure 6A:
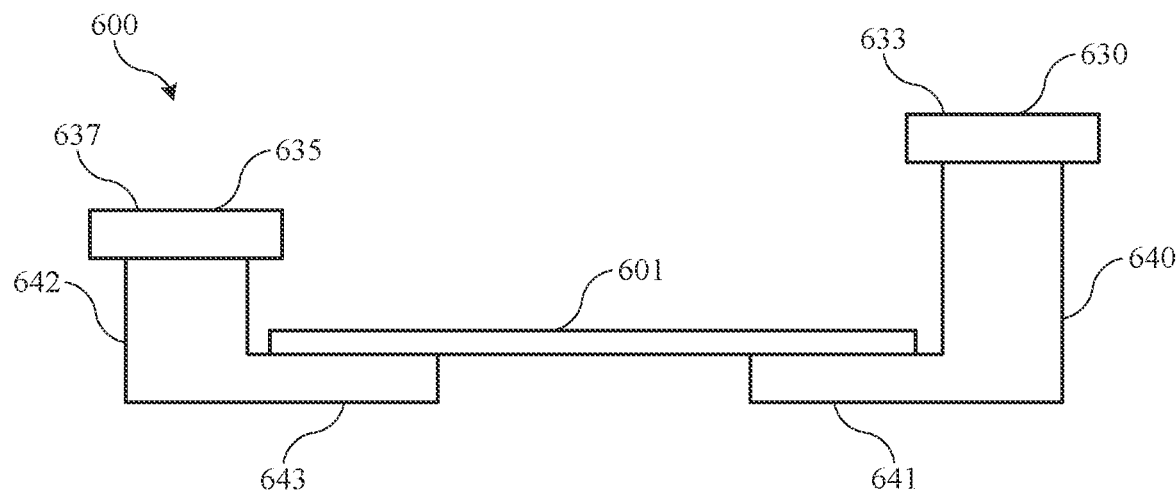
FIGS. 6A-6B show schematic views of substrate seating according to some embodiments of the present technology.
Figure 6B:
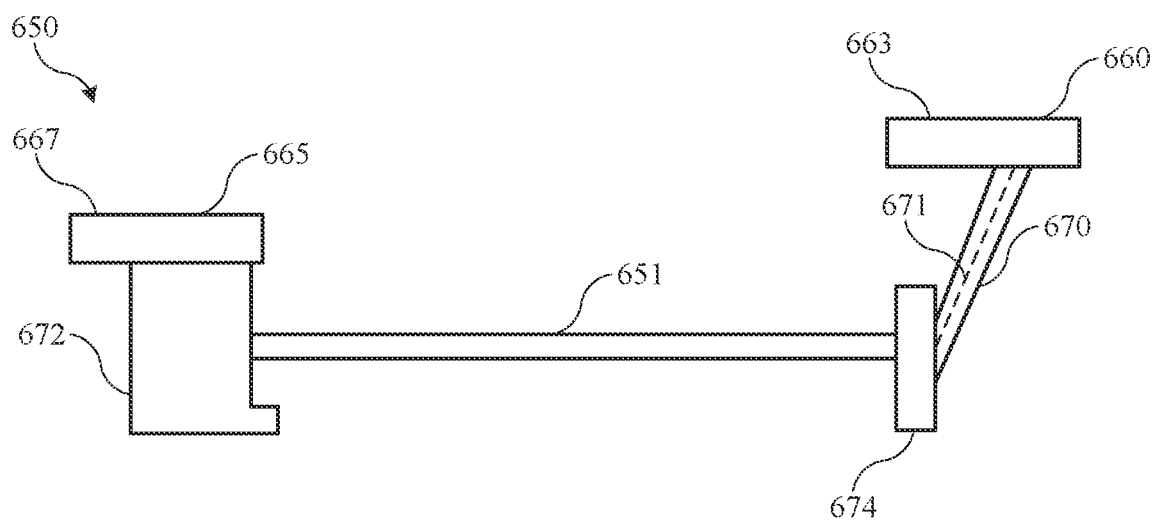

As previously noted, the transfer apparatus may include passive or active engagement of the substrate with different end piece configurations. FIGS. 6A-6B show schematic views of substrate seating according to some embodiments of the present technology. The figures may include any aspect of the systems or transfer apparatuses described previously, and may show additional aspects of components illustrated previously. Although the figures may illustrate an example of both passive and active engagement, it is to be understood that any number of variations may also be used, and are similarly encompassed by the present technology.

FIG. 6A illustrates an end elevation view, such as at a distal end of a transfer apparatus 600. The illustration may include a distal end of a first arm 633 of a first end effector 630, as well as a distal end of a second arm 637 of a second end effector 635. As previously explained, the first end effector 630 and second end effector 635 may be vertically offset from one another along the central hub. Although first end effector 630 is illustrated above second end effector 635, it is to be understood the components could be reversed. A first end piece 640 may be coupled with the first arm 633 of the first end effector 630, and a second end piece 642 may be coupled with the second arm 637 of the second end effector 635 as previously described. FIG. 6A may illustrate a passive engagement of substrate 601, in which a support surface is provided, on which the substrate may be seated. Each of the first end piece 640 and the second end piece 642 may define a recessed ledge including a shelf portion extending towards an associated end piece for substrate support. First end piece 640 may define shelf 641 extending towards the associated second end piece 642, and second end piece 642 may define shelf 643 extending towards the associated first end piece 640. Together, the shelves may produce a wafer support surface about two exterior or radial edges of substrate 601.

Although in some embodiments the first end piece and the second end piece may be similar components, in some embodiments the two components may be modified to account for the vertical offset of the end effectors. For example, despite the vertical offset of the end effectors, the first end piece and the second end piece may extend vertically to a similar horizontal plane through the central axis of the central hub. Accordingly, the first end piece and the second end piece may compensate for the vertical offset to maintain or produce a substantially planar surface for substrate support. Thus, first end piece 640 may extend vertically further than second end piece 642 to account for the offset. Hence, by this accommodation, shelf 641 and shelf 643 may be substantially aligned along a horizontal plane.

FIG. 6B may illustrate an active engagement, which may facilitate faster translation because the substrate may not be susceptible to movement with active engagement. The illustration may show transfer apparatus 650 for supporting substrate 651. The components of the apparatus may include a distal end of a first arm 663 of a first end effector 660, as well as a distal end of a second arm 667 of a second end effector 665. Again as previously explained, the first end effector 660 and second end effector 665 may be vertically offset from one another along the central hub, and although first end effector 660 is illustrated above second end effector 665, it is to be understood the components could be reversed. A first end piece 670 may be coupled with the first arm 663 of the first end effector 660, and a second end piece 672 may be coupled with the second arm 667 of the second end effector 665 as previously described Different from the end pieces of FIG. 6A, first end piece 670 and second end piece 672 may be configured to contact an edge region of substrate 651. Second end piece 672 may be configured to receive the substrate against a surface of the end piece, and may include a material configured to support contact between the substrate and the end piece within the transfer region environmental conditions. First end piece 670 may be configured to apply a force against the substrate 651 to mechanically, electrically, or otherwise seat the substrate against the second end piece. For example, first end piece 670 may include a spring-loaded or similar physical coupling plunger that may mechanically or otherwise force the substrate against the second end piece, and which may include a roller 674 or other component for directly contacting a substrate. Additionally, the force-generating end piece may provide an electrical coupling, such as by electrostatically engaging the substrate along component 674, which may be conductive or may otherwise facilitate the coupling. In such a configuration, with the first end effector coupled with the interior shaft or first shaft, electrical leads 671 may be delivered through the first shaft of the central hub and out to first end pieces 670 of each first arm without impacting any other component of the central hub. Any number of other mechanical or attractive forces may be applied to releasably engage the substrate during transfer within the substrate processing system.

The present technology includes substrate processing systems that may accommodate additional substrate supports that may not otherwise be accessible to centrally located transfer robots as previously described. By incorporating transfer apparatuses according to embodiments of the present technology, multiple substrate supports may be utilized and accessed during substrate processing. When transfer apparatuses include first end effectors and second end effectors as described throughout the present technology, the movements to engage, transfer, and disengage with substrates may all be performed along exterior edges of the substrates, which may facilitate avoiding lift pins along an interior of the substrate support. The systems may also provide increased transfer speeds by maintaining exterior contact and recess positions for the arms of the end effectors relative to the substrates.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a substrate" includes a plurality of such substrates, and reference to "the arm" includes reference to one or more arms and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
   a transfer region housing defining a transfer region, wherein a sidewall of the transfer region housing defines a sealable access for providing and receiving substrates;
   a plurality of substrate supports disposed within the transfer region; and
   a transfer apparatus comprising:
      a central hub including a first shaft and a second shaft extending about and concentric with the first shaft, wherein the second shaft is counter-rotatable with the first shaft,
      a first end effector coupled with the first shaft, the first end effector comprising a plurality of first arms having a number of first arms equal to a number of substrate supports of the plurality of substrate supports, wherein:
the first end effector further comprises a plurality of first end pieces; and
each first end piece of the plurality of first end pieces comprises a first contact member that engages a lateral surface of a substrate and does not include a horizontally extending shelf, and
a second end effector coupled with the second shaft, the second end effector comprising a plurality of second arms having a number of second arms equal to the number of first arms of the first end effector, wherein:
the second end effector further comprises a plurality of second end pieces; and
each second end piece of the plurality of second end pieces comprises a second contact member that engages the lateral surface of the substrate.

2. The substrate processing system of claim 1, wherein each first contact member comprises a roller.

3. The substrate processing system of claim 1, wherein:
each first contact member comprises an electrically conductive material;
each first contact member is coupled with one or more electrical leads; and
each first contact member generates an electrostatic force to engage the substrate.

4. The substrate processing system of claim 3, wherein the one of more electrical leads extend through the first shaft.

5. The substrate processing system of claim 1, wherein each first contact member and each second contact member extend vertically to a similar plane extending orthogonally to the central hub.

6. The substrate processing system of claim 1, wherein the first end effector and the second end effector are vertically offset relative to one another along the central hub.

7. The substrate processing system of claim 1, wherein each first end piece of the plurality of first end pieces comprises a spring loaded plunger that is coupled with a respective one of the first contact members.

8. The substrate processing system of claim 1, wherein each first end piece is configured to releasably engage an edge of a substrate against a corresponding second end piece.

9. The substrate processing system of claim 1, wherein the central hub is vertically translatable along a central axis of the central hub.

10. A method of transferring a substrate, the method comprising:
receiving a substrate at a first substrate support within a transfer region of a substrate processing system, the substrate processing system including a transfer apparatus comprising:
a central hub including a first shaft and a second shaft extending about and concentric with the first shaft,
a first end effector coupled with the first shaft, the first end effector comprising a plurality of first arms, wherein:
the first end effector further comprises a plurality of first end pieces; and
each first end piece of the plurality of first end pieces comprises a first contact member that engages a lateral surface of a substrate, and
a second end effector coupled with the second shaft, the second end effector comprising a plurality of second arms having a number of second arms equal to a number of first arms of the first end effector, wherein:
the second end effector further comprises a plurality of second end pieces; and
each second end piece of the plurality of second end pieces comprises a second contact member that engages the lateral surface of the substrate;
rotating the first shaft in a first direction about a central axis of the central hub;
rotating the second shaft in a second direction about the central axis of the central hub;
applying a force against a lateral surface of the substrate with the first contact member, engaging the lateral surface of the substrate with the first contact member of a first respective arm of the plurality first arms and the second contact member of a second respective arm of the plurality of second arms;
co-rotating the first respective arm and the second respective arm about the central axis to reposition the substrate; and
delivering the substrate to a second substrate support of the substrate processing system.

11. The method of transferring a substrate of claim 10, further comprising disengaging the substrate from the transfer apparatus by rotating the first shaft in the second direction about the central axis and rotating the second shaft in the first direction about the central axis.

12. The method of transferring a substrate of claim 10, further comprising, subsequent engaging the substrate, lifting the substrate from the first substrate support by translating the transfer apparatus vertically within the transfer region.

13. The method of transferring a substrate of claim 10, further comprising, subsequent engaging the substrate, recessing the first substrate support from the substrate.

14. The method of transferring a substrate of claim 10, wherein engaging the lateral surface of the substrate comprises applying an electrostatic force to the substrate via the first contact member of the first respective arm.

15. The method of transferring a substrate of claim 14, wherein the lateral surface of the substrate comprises using a spring-loaded plunger coupled with the first contact member of the first respective arm to mechanically force the lateral surface of the substrate against the second contact member of the second respective arm.

16. The method of transferring a substrate of claim 10, wherein the substrate processing system includes at least four substrates, and wherein engaging the substrate comprises simultaneously engaging the at least four substrates with the first end effector and the second end effector.

17. The method of transferring a substrate of claim 10, further comprising, prior to delivering the substrate to the second substrate support, delivering the substrate to an alignment hub positioned between the first substrate support and the second substrate support.

18. A substrate processing system comprising:
a transfer region housing defining a transfer region, wherein a sidewall of the transfer region housing defines a sealable access for providing and receiving substrates;
a plurality of substrate supports disposed within the transfer region; and
a transfer apparatus comprising:
a central hub including a first shaft and a second shaft extending about and concentric with the first shaft, wherein the second shaft is independently rotatable from the first shaft,
a first end effector coupled with the first shaft, the first end effector comprising a plurality of first arms extending radially outward from the central hub to a distal end of each first arm of the plurality of first arms, wherein:
each first arm is characterized by an arcuate shape extending along a first arc path to the distal end of each first arm;
the first end effector further comprises a plurality of first end pieces; and
each first end piece of the plurality of first end pieces comprises a first contact member that engages a lateral surface of a substrate, and a second end effector coupled with the second shaft, the second end effector comprising a plurality of second arms extending radially outward from the central hub to a distal end of each second arm of the plurality of second arms, wherein:
the second end effector further comprises a plurality of second end pieces;
each second end piece of the plurality of second end pieces comprises a second contact member that engages the lateral surface of the substrate;
each second arm is characterized by an arcuate shape extending along a second arc path to the distal end of each second arm; and
the second arc path is the first arc path mirrored about a lateral axis extending from the central hub normal to a central axis of the central hub, and
wherein each first end piece of the plurality of first end pieces comprises a spring loaded plunger translatable towards the second end piece, that is coupled with a respective one of the first contact members.

19. The substrate processing system of claim 18, wherein the central hub is vertically translatable along the central axis of the central hub.

20. The substrate processing system of claim 18, wherein the plurality of substrate supports comprises at least four substrate supports.

* * * * *